(12) United States Patent
Yang et al.

(10) Patent No.: US 8,814,225 B2
(45) Date of Patent: Aug. 26, 2014

(54) LOCKING STRUCTURE AND ELECTRONIC DEVICE WITH THE SAME

(75) Inventors: Jian-Yong Yang, Shenzhen (CN); Xue-Dong Tang, Shenzhen (CN); Hong-Wu Wang, New Taipei (TW); Wei Liu, Shenzhen (CN); Yen-Wen Wang, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 428 days.

(21) Appl. No.: 13/210,383

(22) Filed: Aug. 16, 2011

(65) Prior Publication Data

US 2012/0320499 A1     Dec. 20, 2012

(30) Foreign Application Priority Data

Jun. 16, 2011    (CN) .......................... 2011 1 0161704

(51) Int. Cl.
*E05C 19/00*    (2006.01)
*E05C 5/02*    (2006.01)

(52) U.S. Cl.
USPC .............. 292/1; 292/57; 292/95; 292/DIG. 4; 292/DIG. 11

(58) Field of Classification Search
USPC .......... 292/1, 57–62, 95, 96, DIG. 4, DIG. 11
See application file for complete search history.

(56) References Cited

U.S. PATENT DOCUMENTS

| | | | | |
|---|---|---|---|---|
| 3,602,600 A * | 8/1971 | Kanski | .......................... | 401/115 |
| 3,679,317 A * | 7/1972 | Larson | ......................... | 401/109 |
| 3,819,282 A * | 6/1974 | Schultz | ........................ | 401/105 |
| 6,325,427 B1 * | 12/2001 | Daoud | ............................. | 292/27 |
| 6,874,825 B1 * | 4/2005 | Rauner | ................................ | 292/61 |
| 7,152,892 B2 * | 12/2006 | Rechberg | ....................... | 292/304 |
| 7,367,597 B2 * | 5/2008 | Rechberg | ....................... | 292/304 |
| 7,520,540 B2 * | 4/2009 | Lin et al. | .......................... | 292/83 |
| 7,675,753 B2 | 3/2010 | Li et al. | | |
| 7,695,031 B2 * | 4/2010 | Jackson et al. | ................ | 292/169 |
| 7,780,203 B2 * | 8/2010 | Jan et al. | .......................... | 292/27 |
| 7,815,227 B2 * | 10/2010 | Jan et al. | .......................... | 292/27 |
| 8,020,900 B2 * | 9/2011 | Li et al. | ............................ | 292/61 |

FOREIGN PATENT DOCUMENTS

CN     201156229 Y     11/2008
CN     101492984 A     7/2009

* cited by examiner

*Primary Examiner* — Carlos Lugo
(74) *Attorney, Agent, or Firm* — Novak Druce Connolly Bove + Quigg LLP

(57) ABSTRACT

A locking structure includes a hook disposed on a first object and engagable with a locking member disposed on a second object. The locking member includes a main body rotatable about an axis thereof and a number of locking portions radially protruding from the main body. When the main body rotates about the axis, the locking portions rotate together with the main body to engage with and disengage from the hook to lock the first object to and unlock the first object from the second object.

20 Claims, 7 Drawing Sheets

LOCKING STRUCTURE AND ELECTRONIC DEVICE WITH THE SAME

BACKGROUND

1. Technical Field

The present disclosure relates to electronic devices, and in particular, to an electronic device with a locking structure.

2. Description of Related Art

Locking structures are often used for locking two objects together. Locking structures often include an elastic hook protruding from a first object and a slot defined in a second object. When the first object is locked to the second object, the elastic hook is deformed to be inserted into the slot and then restore to its original shape. When users want to unlock the first object from the second object, considerable strength or force should be applied to make the elastic hook deform and move out of the slot. This is inconvenient and may easily result in damage to the objects.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
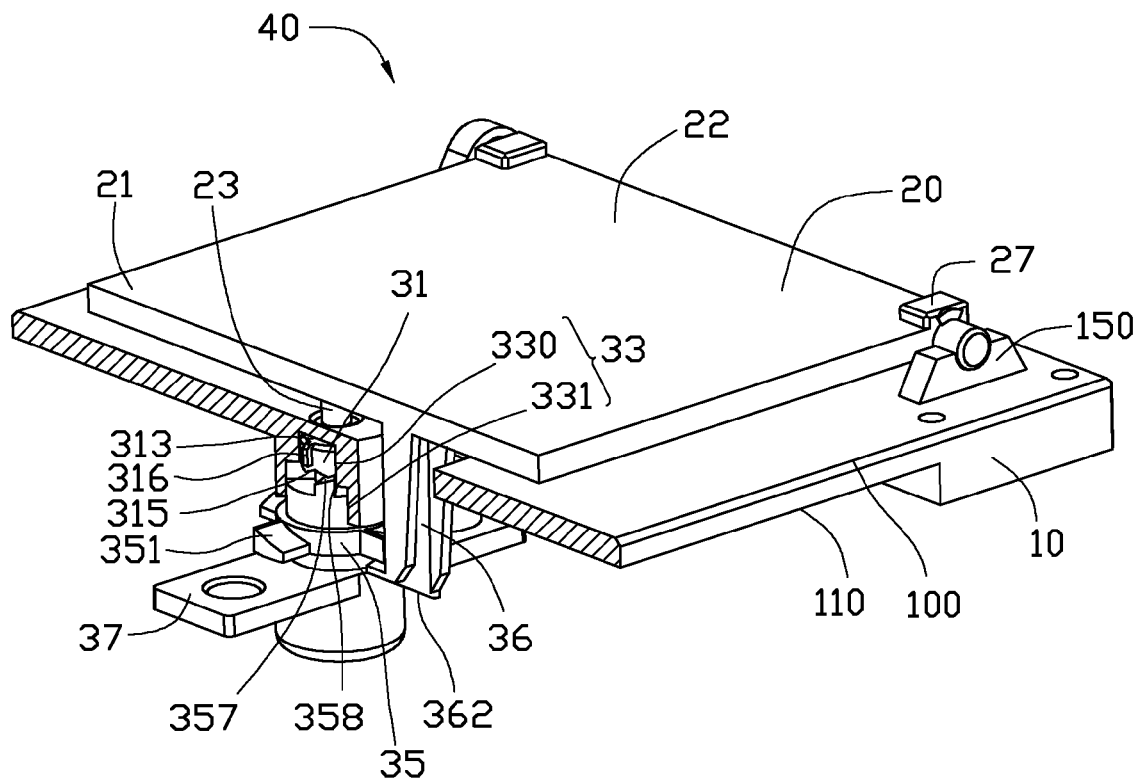
FIG. 1 is a schematic view of a locking structure according to an embodiment of the present disclosure. The locking structure includes a driving member, a restricting member, and a locking member in a locked position.

Referring to FIG. 1, an electronic device 40 includes a housing 10, a cover 20 pivotably connected to the housing 10, and a locking structure 30 (see FIG. 2) for locking the cover 20 to the housing 10. In some embodiments, the electronic device 40 may be a potable DVD player with necessary components (not shown) for operating the player mounted in the housing 10, and the cover 20 may be a lid for covering a disk. In other embodiments, the electronic device 40 may be other devices having a cover such as a notebook computer.

Figure 2:
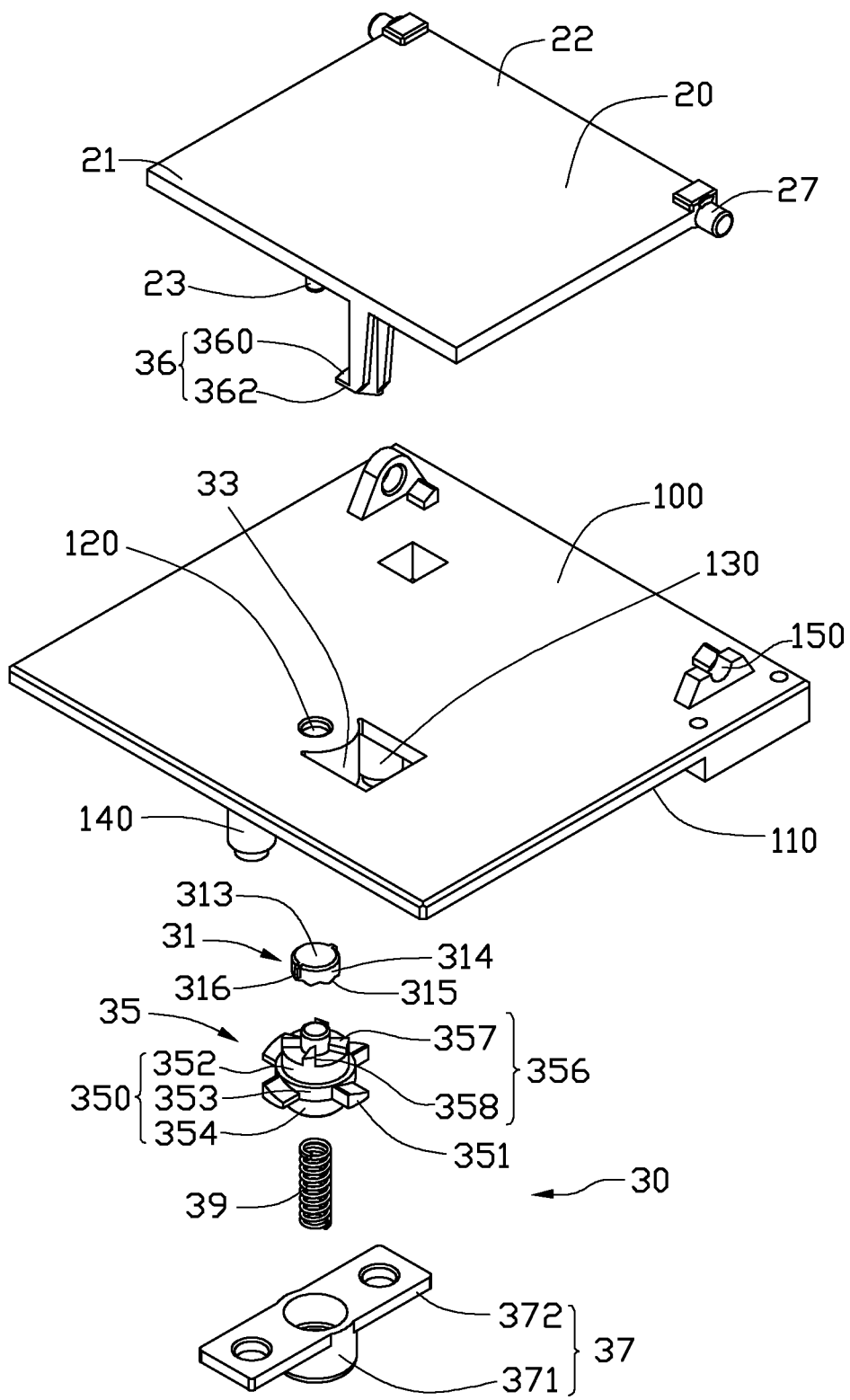
FIG. 2 is an exploded view of the locking structure of FIG. 1.

Referring also to FIG. 2, the housing 10 includes a first surface 100 and a second surface 110 opposite to the first surface 100. A first through hole 120 and a second through hole 130 adjacent to the first through hole 120 are defined in the housing 10 to communicate the first surface 100 with the second surface 110. Two fixing portions 140 protrude from the second surface 110, and two first hinge members 150 protrude from the first surface 100.

The cover 20 covers on the first surface 100 of the housing 10. The cover 20 includes a first end 21, a second end 22 opposite to the first end 21, a push portion 23 and a hook 36 protruding from the first end 21, and two second hinge members 27 protruding from the second end 22 for engaging with the first hinge members 150 respectively to pivotably connect the cover 20 to the housing 10. The push portion 23 corresponds to the first through hole 120 and can be inserted into the first through hole 120. In some embodiments, the push portion 23 is made of elastic material.

The locking structure 30 includes a driving member 31, a restricting member 33, a locking member 35, a hook 36, a support member 37, and an elastic member 39. The locking member 35 is engagable with the driving member 31, the restricting member 33, and the elastic member 39 in a locked position. When in the locked position, the locking member 35 can engage with the hook 36 to lock the cover 20 to the housing 10.

The driving member 31 corresponds to the first through hole 120. The driving member 31 is substantially a hollow cylinder. The driving member 31 includes a circular top wall 313 and a side wall 314 protruding from the top wall 313, and two protrusions 316 protruding from an outer surface of the sidewall 314. The distal end of the sidewall 314 defines a number of driving surfaces 315. In some embodiments, the driving surfaces 315 are evenly-spaced inclined surfaces.

Figure 3:
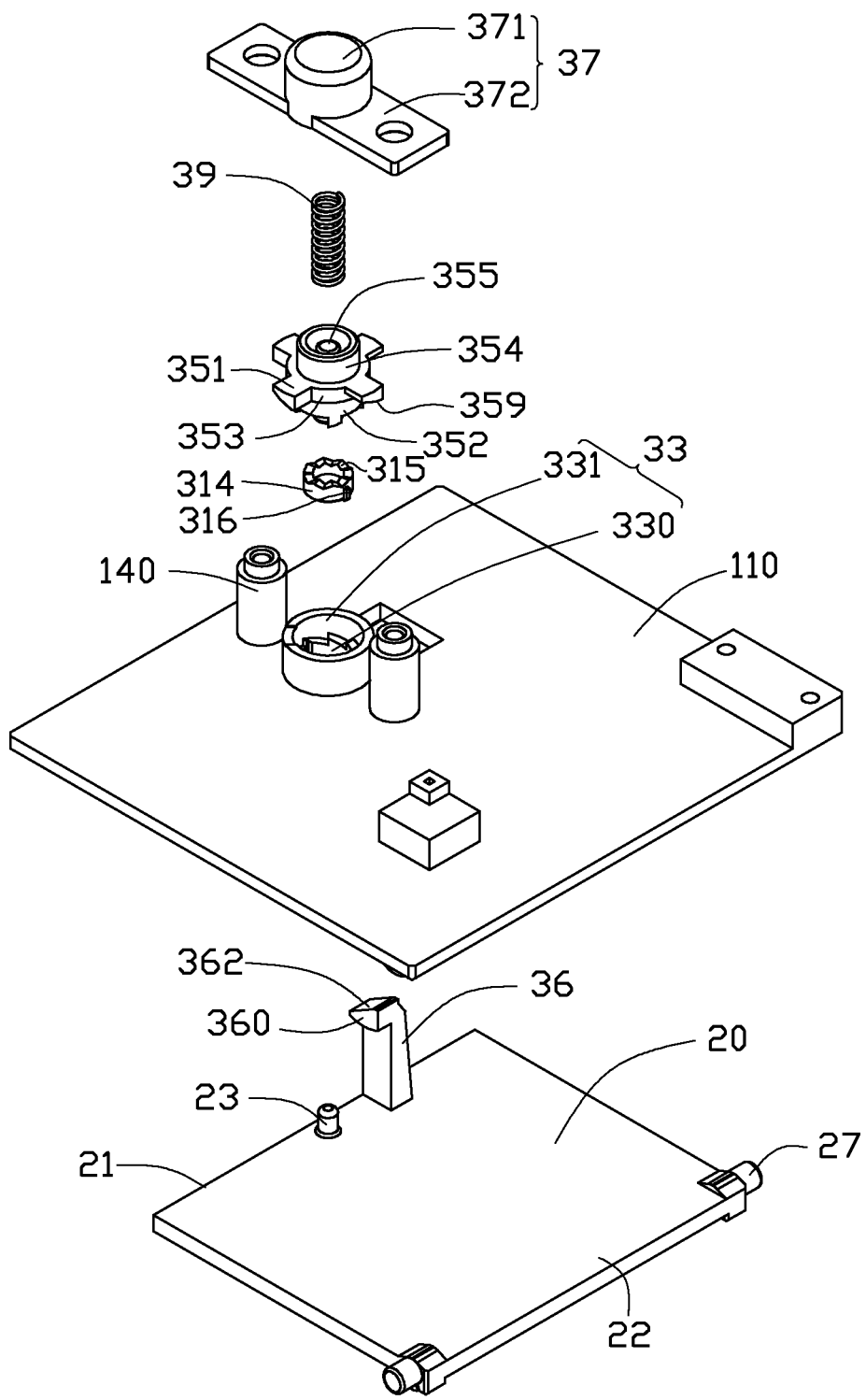
FIG. 3 is similar to FIG. 2 but from a reverse angle.
Figure 4:
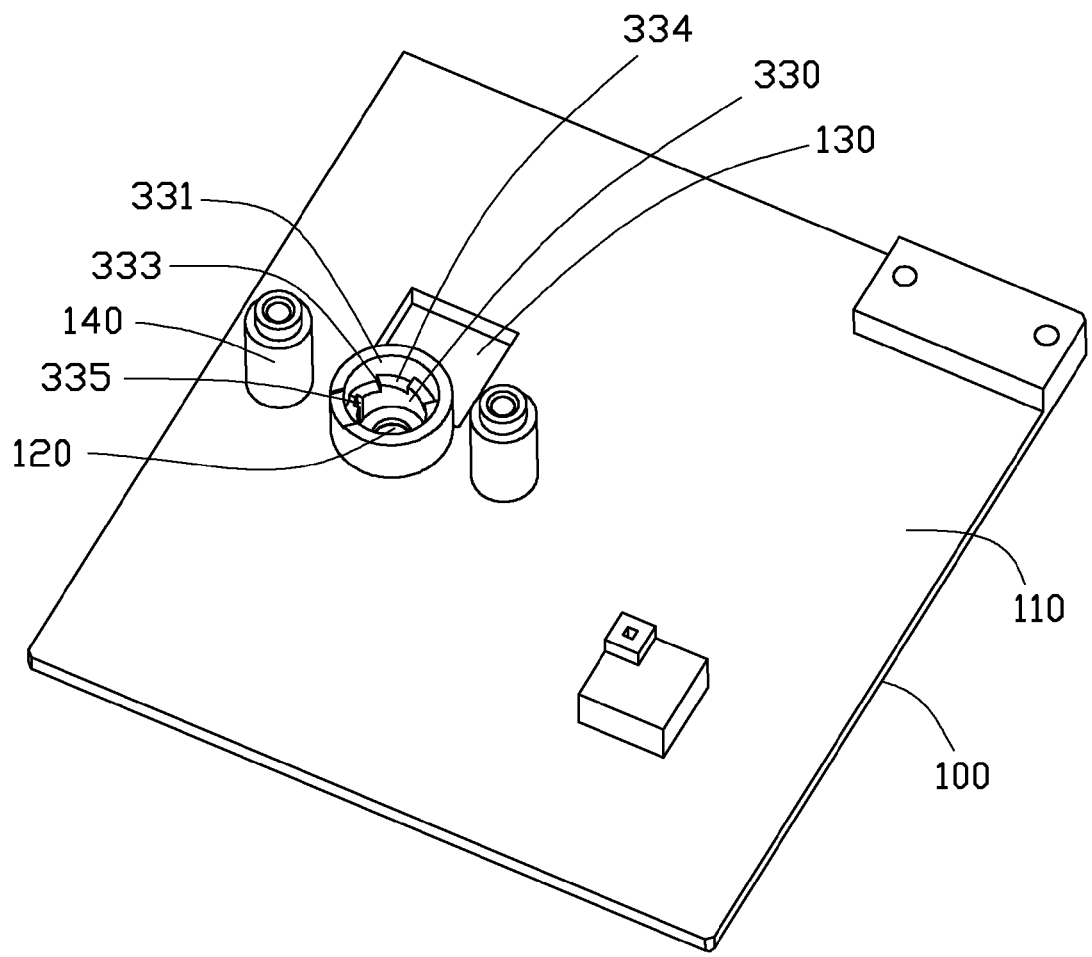
FIG. 4 is a partly schematic view of the locking structure of FIG. 1.

Referring to FIG. 3, the restricting member 33 protrudes from the second surface 110. The restricting member 33 includes a first restricting portion 330 receiving the driving member 31 therein and a second restricting portion 331 surrounding the first restricting portion 330. In the illustrated embodiment, both the first restricting portion 330 and the second restricting portion 331 are cylindrical and coaxial. As shown in FIG. 4, a free end of the first restricting portion 330 defines a number of abutting surfaces 333 and a number of first inclined surfaces 334. Each abutting surface 333 is defined between two adjacent first inclined surfaces 334 and connects the two adjacent first inclined surfaces 334. In the illustrated embodiment, each abutting surface 333 is substantially perpendicular to the second surface 110. Two depressions 335 are defined in an interior surface of the first restricting portion 330 for engaging with the two protrusions 316 respectively to restrict the driving member 31 from rotating circumferentially.

Referring again to FIGS. 2 and 3, the locking member 35 includes a cylindrical main body 350 and four trapezoidal locking portions 351 radially protruding from an outer surface of the main body 350. The main body 350 has an axis A (see FIG. 6), and the main body 350 can move upwards and downwards along the axis A and also can rotate clockwise or counterclockwise about the axis A to drive the locking portions 351 to rotate together.

The main body 350 includes a first portion 352, a third portion 354 opposite to the first portion 352, and a second portion 353 located between the first and third portions 352, 354. The three portions 352, 353, and 354 are arranged in order along the axis A away from the driving member 31. As shown in FIG. 2, a free end of the first portion 352 forms four wedged-shaped engaging portions 356. Each engaging portion 356 defines a second inclined surface 357 and a resisting surface 358. The second inclined surface 357 is formed on one side of each engaging portion 356 which is away from the second portion 353. The second inclined surface 357 can meanwhile engage with the corresponding first inclined surface 334 of the restricting member 33 and the corresponding driving surface 315 of the driving member 31. The resisting surface 358 is connected to the second inclined surface 357 and substantially perpendicular to the second surface 110 of the housing 10 for abutting against the corresponding abutting surface 333 of the driving member 31. A free end of the third portion 354 is depressed to define a connection portion 355. The diameter of the second portion 353 is larger than that of the first portion 352 and the third portion 354.

The locking portions 351 are spaced apart and radially protrude from the outer surface of the second portion 353. In the illustrated embodiment, the locking portions 351 are evenly-spaced. Each locking portion 351 is substantially trapezoidal and one side thereof, which is adjacent to the first portion 352, defines a third inclined surface 359. The hook 36 protrudes from the cover 20 and can hook to at least one locking portion 351 or be located in the space defined between two adjacent locking portions 351 as the main body 350 rotates about the axis A. The hook 36 protrudes from the cover 20 and is capable of passing through the second through hole 130 of the housing 10 to engage with or disengage from the locking portions 351. The hook 36 includes a hook portion 360 defining a forth inclined surface 362 on the free end thereof for engaging with the third inclined surface 359 of each locking portion 351.

The supporting member 37 is connected to the cover 20 for supporting the locking member 35. The supporting member 37 includes a receiving slot 371 for receiving the third portion 354 of the main body 350, and two supporting portions 372 protruding from the receiving slot 371 for engaging with the fixing portions 140 respectively. The diameter of the receiving slot 371 may be slightly larger than that of the third portion 354 such that the third portion 354 can move upwards and downwards in the receiving slot 371 easily. The elastic member 39 is disposed between the locking member 35 and the supporting member 37 for supplying an elastic force to drive the locking member 35 to move upwards along the axis A. One end of the elastic member 39 is sleeved on the connection portion 355 while the other end abuts the receiving slot 371.

Figure 5:
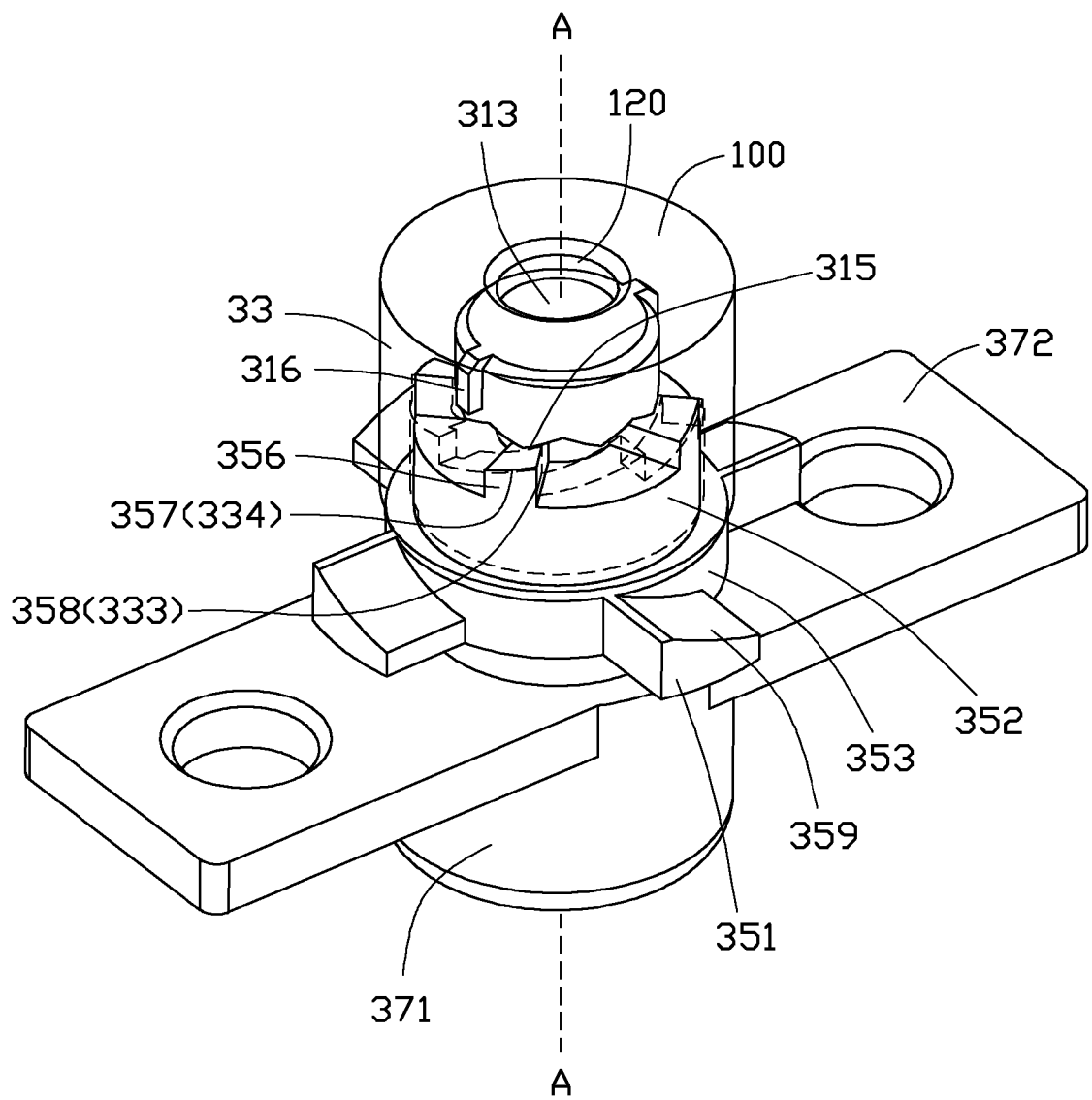
FIG. 5 is a schematic view showing the engagement between the driving member, the restricting member, and the locking member of FIG. 1.

Referring to FIGS. 1, 2 and 5, in assembly, the cover 20 is pivotably connected to the first surface 100 and engaged between the first hinge members 150 and the second hinge members 27. The driving member 31 is received in the first restricting portion 330, with the protrusions 316 being received in the depressions 335 (see FIG. 4) respectively. In this state, the top wall 313 is partly exposed above the first surface 100 through the first through hole 120. The first portion 352 is inserted into the second restricting portion 331, with the second inclined surface 357 and the resisting surface 358 of each engaging portion 356 respectively abutting against one first inclined surface 334 and one abutting surface 333 of the first restricting portion 330. The second inclined surface 357 of each engaging portion 356 at the same time abuts against one driving surface 315. After one end of the elastic member 39 is sleeved on the connection portion 355, the supporting portions 372 are connected to the fixing portions 140 respectively, and the receiving slot 371 in this state abuts the other end of the elastic member 39.

When the locking member 35 is in the locked position, the hook 36 hooks to one side of one locking portion 356 which is away from the first portion 352 to lock the cover 20 to the housing 10. When the first end 21 is pushed by an outer force, the push portion 23 moves downwards to abut the top wall 313 to drive the driving member 31 to move downwards along the axis A. With the engagement between the corresponding driving surface 315 and the second inclined surface 357 of each engaging portion 356, the driving member 31 supplies a first force component and a second force component to drive the main body 350 to move downwards and rotate counterclockwise. However, since the corresponding abutting surface 333 of the restricting member 33 abuts the resisting surface 358 of each engaging portion 356, the main body 350 is restricted from rotating about the axis A and is only allowed to move downwards along the axis A.

Figure 6:
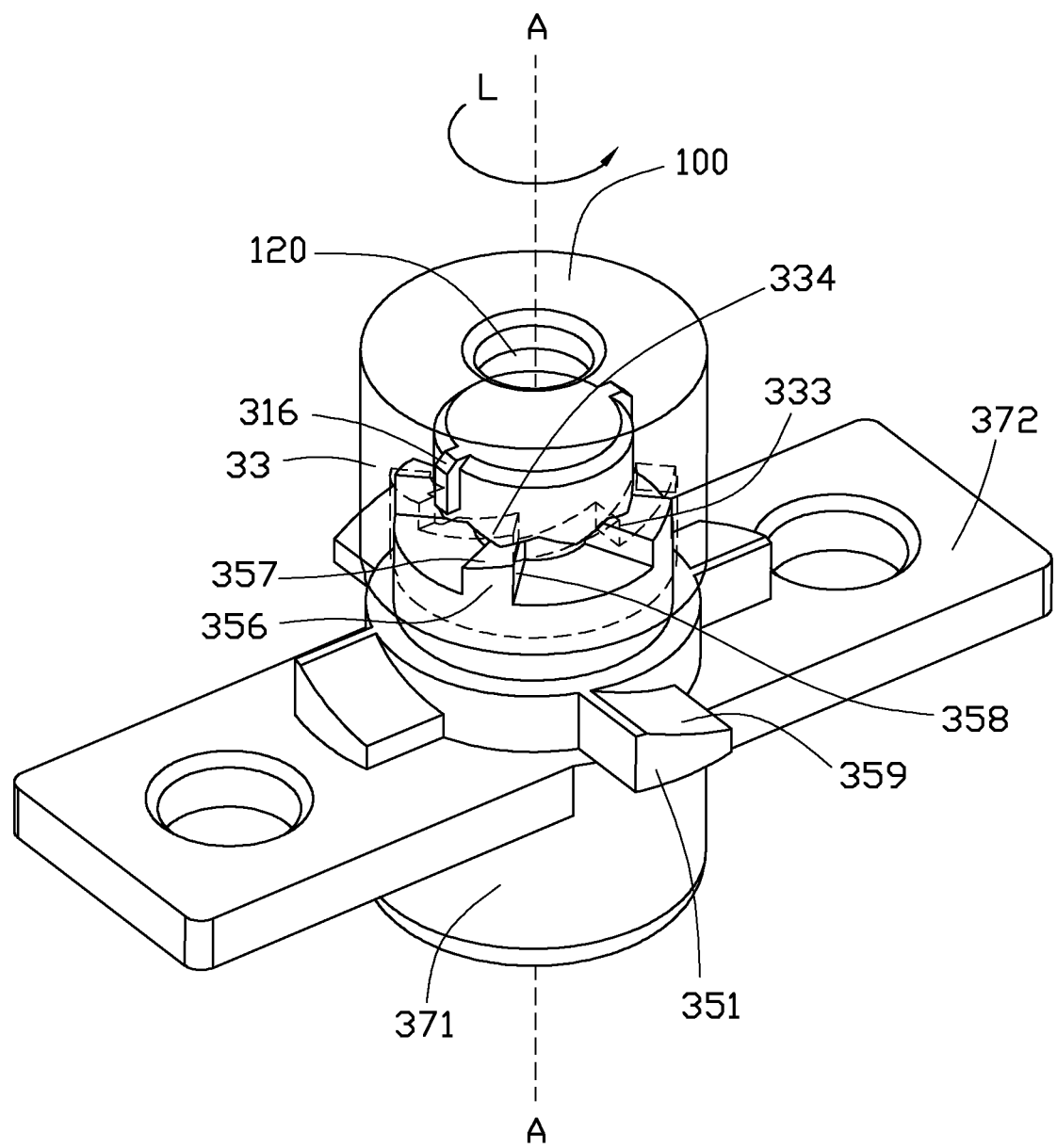
FIG. 6 is similar to FIG. 5 with the locking member in a critical position.
Figure 7:
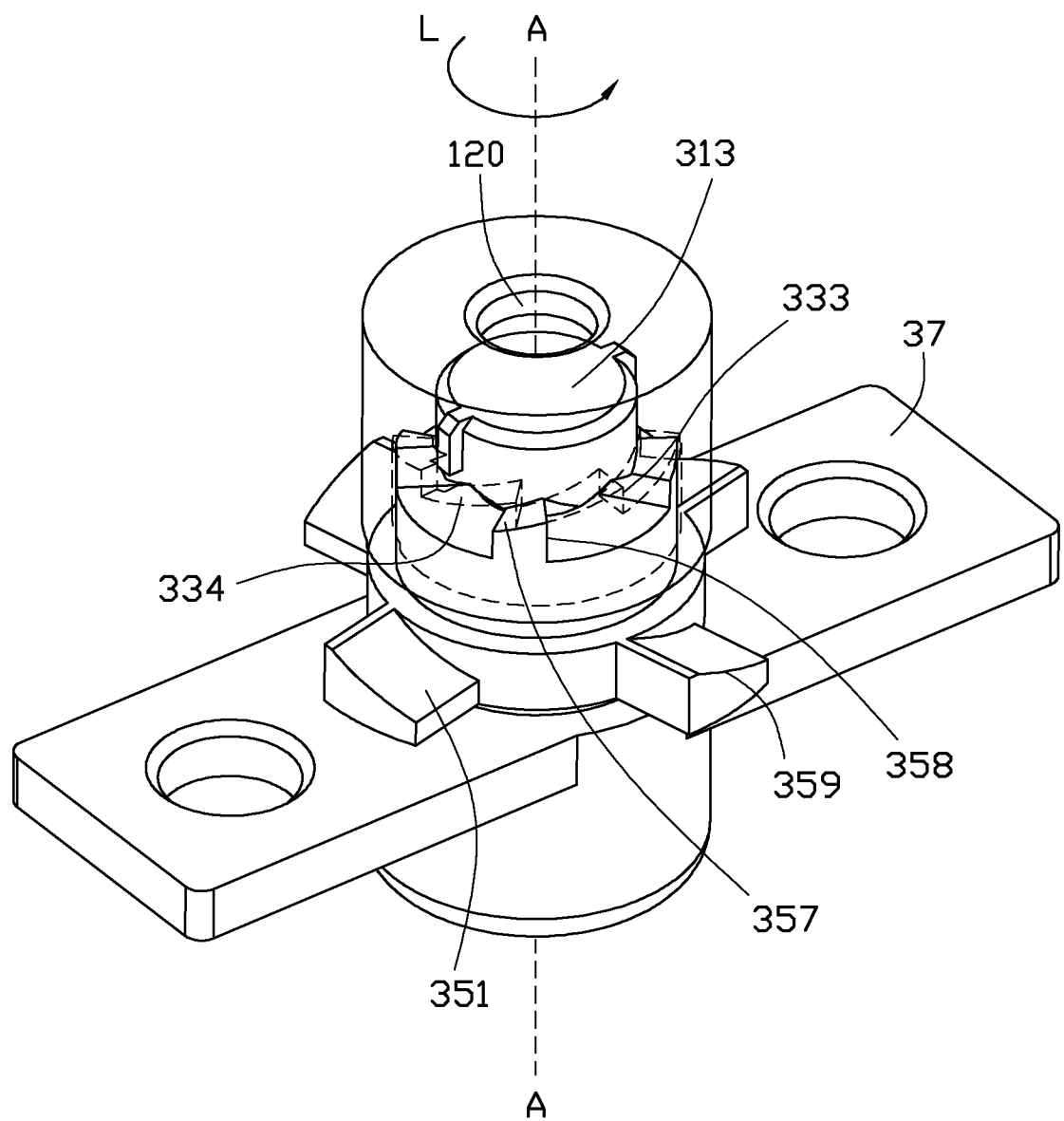
FIG. 7 is similar to FIG. 5 with the locking member in a transition position.

As the main body 350 move downwards, the elastic member 39 is gradually compressed to store an elastic force. After the locking member move downwards for a predetermined distance to a critical position as shown in FIG. 6, for example, a distance equal to the height of each engaging portion 356 along the axis A, and is located under the driving member 31, the resisting surface 358 of each engaging portion 356 no longer abuts against the corresponding abutting surface 333. In this state, even if the outer force applied to the cover 20 is removed, the locking member 35 will continue to rotate in a counterclockwise direction L about the axis A through a transition position, as shown in FIG. 7, so that engagement is changed from between the corresponding driving surface 315 and the second inclined surface 357 to the next driving surface 315.

After the outer force is removed, the elastic force from the elastic member 39 drives the main body 350 to move upwards and closer to the second surface 110 along the axis A. At the same time, the first inclined surface 334 abuts against the second inclined surface 357 and the main body 350 is driven to rotate about the axis A along the counterclockwise direction L while moving upwards. Therefore, the locking portions 351 are driven to rotate counterclockwise to the corresponding locking portions 351 and no longer engage with the hook 36. When the main body 350 moves to where the next abutting surface 333 abuts the resisting surface 358, the hook 36 corresponds to the space defined between two adjacent locking portions 351 and the locking member 35 is in the unlocked position. The cover 20 thus can be unlocked from the housing 10.

The cover 20 can be locked to the housing 10 when the locking member 35 is in the locked position. As the cover 20 rotates relative to the housing 10, the hook 36 gets closer to the housing 10 and passes through the second through hole 130 to abut against the corresponding locking portion 351. The forth inclined surface 362 of the hook portion 360 abuts the third inclined surface 359 of the corresponding locking portion 351, driving the locking member 35 to move downwards and rotate clockwise. The second inclined surface 357 of each engaging portion 356 is driven to slide relative to the first inclined surface 334 of the restricting member 33 and the driving surface 315 of the driving member 31. When the cover 20 completely covers on the housing 10, the hook portion 360 is located under the locking portion 351 and no longer moves downwards. At this time, the elastic member 37 returns to its original position and drives the main body 350 to move upwards along the axis A. The locking portion 351 thus is stably located above the hook portion 360 and the engaging portion 356 also returns to its original position where the abutting surface 333 abuts against the resisting surface 358. In this state, the locking member 35 is still in the locked position and the cover 20 is locked to the housing 10.

It should be noted that although the engaging portion 356 applies a clockwise force or counterclockwise force to the driving member 31 as the main body 350 moves upwards and downwards along the axis A, the driving member 31 cannot rotate about the axis A because of the engagement between the protrusions 316 and the depressions 335.

It can be understood that the number of the driving surfaces 315, the first inclined surfaces 334, the engaging portions 356, or the number of the locking portions 351 are not limited to this embodiment. In other embodiments, number of the above components can be changed according to the function of the locking structure 30.

With the locking structure 30, the cover 20 of the electronic device 40 can be locked to the housing 10 because of the engagement between the hook 36 and the corresponding locking portion 351. Additionally, the cover 20 can be unlocked from the housing 10 easily when the first end 21 is pushed.

Even though information and the advantages of the present embodiments have been set forth in the foregoing description, together with details of the structures and functions of the present embodiments, the disclosure is illustrative only; and that changes may be made in detail, especially in matters of shape, size, and arrangement of parts within the principles of the present embodiments to the full extent indicated by the broad general meaning of the terms in which the appended claims are expressed.

What is claimed is:

1. A locking structure for locking a first object to a second object, comprising:
   a hook disposed on the first object and being insertable through the second object; and
   a locking member disposed on the second object, comprising:
   a main body with an axis; and
   a plurality of locking portions radially protruding from the main body;
   wherein the locking structure comprises a driving member and an elastic member; the driving member is disposed on the main body and engages with the main body; the elastic member connects with the main body; the first object comprises a push portion; when the first object is pressed, the push portion drives the driving member, the driving member drives the main body to move along the axis for a predetermined distance in a first direction and compresses the elastic member for storing an elastic force, and then the main body rotates about the axis, the locking portions rotates together with the main body to disengage from the hook to unlock the first object from the second object; the main body also moves along the axis for the predetermined distance in a second direction opposite to the first direction and rotates about the axis by the elastic force, the locking portions rotates together with the main body to selectively engage with or disengage from the hook to lock the first object to or unlock the first object from the second object.

2. The locking structure as claimed in claim 1, wherein the main body is movable along the axis, the driving member defines a plurality of driving surfaces engaged with the main body, the driving member is capable of driving the main body to rotate about the axis and move along the axis in the first direction; the push portion, the driving member, and the locking member are arrange in a line.

3. The locking structure as claimed in claim 2, wherein the locking structure further comprises a restricting member being engagable with the locking member for restricting the main body from rotating about the axis before moving along the axis in the first direction for the predetermined distance.

4. The locking structure as claimed in claim 3, wherein the restricting member engages with the main body to drive the main body to rotate about the axis when the locking member moves along the axis in the second direction.

5. The locking structure as claimed in claim 4, wherein the restricting member defines a plurality of abutting surfaces, the main body defines a plurality of resisting surfaces parallel to the axis thereof engaging with the abutting surfaces for restricting the main body from rotating about the axis before moving along the axis in the first direction for a predetermined distance.

6. The locking structure as claimed in claim 5, wherein the restricting member further defines a plurality of first inclined surfaces each which is defined between two adjacent abutting surfaces and connects the two adjacent abutting surfaces, the main body further defines a plurality of second inclined surfaces connected to the abutting surfaces respectively for engaging with the first inclined surfaces respectively to drive the main body to rotate about the axis when moving along the axis in the second direction.

7. The locking structure as claimed in claim 6, wherein each second inclined surface is also engagable with the driving surfaces, the driving member drive the main body to move along the axis in the first direction for the engagement between the driving surface and the corresponding second inclined surface.

8. The locking structure as claimed in claim 1, wherein each locking portion defines a third inclined surface and the hook defines a forth inclined surface, the hook drives the corresponding locking portion to rotate about and move along the axis with the engagement between the third inclined surface and the forth inclined surface.

9. The locking structure as claimed in claim 1, wherein the locking structure further comprises a supporting member for supporting the locking member along the axis.

10. The locking structure as claimed in claim 9, wherein the supporting member comprises a receiving slot for partly receiving the main body, the main body can move along the axis and rotate about the axis when being partly received in the receiving slot.

11. The locking structure as claimed in claim 2, wherein the cover defines a through hole corresponding to the driving member, the push portion protrudes from the cover to abut the driving member through the first through hole when the cover is being pushed.

12. The locking structure as claimed in claim 3, wherein at least one protrusion protrudes from the driving member, at least one depression is defined in the first restricting portion for receiving the at least one protrusion for restricting the driving member from rotating about the axis.

13. The locking structure as claimed in claim 7, wherein the restricting member includes a first restricting portion and a second restricting portion communicating with the first restricting portion, the driving member is received in the first restricting portion and the abutting surfaces and first inclined surfaces are defined in the first restricting portion, one end of the main body is inserted in the second restricting portion.

14. The locking structure as claimed in claim 13, wherein the end of the main body inserted in the second restricting portion forms a plurality of evenly-spaced engaging portions each which defines the resisting surface and the second inclined surface.

15. An electronic device, comprising:
   a housing;
   a cover rotatably connected to the housing; and
   a locking structure for locking the cover to the housing and unlocking the cover from the housing, the locking structure comprising:
   a hook protruding from the cover to insert into the housing; and
   a locking member being rotatable relative to the hook to interchange between a locked position and an unlocked position, the locking member comprising:

a main body with an axis; and a plurality of locking portions protruding from the main body and each two adjacent locking portions defining a space therebetween;

wherein the locking structure comprises a driving member, an elastic member, and a restricting member; the first object comprises a push portion for driving the driving member; the push portion is used for driving the main body by the pressed first object; the driving member further defines a plurality of driving surfaces, the driving member drives the locking member to rotate about the axis and move along the axis with the engagement between the driving surface and the main body; the hook hooks to at least one locking portion when the locking member is in the locked position, and the hook corresponds to the space defined between two adjacent locking portions when the locking member is in the unlocked position; the restricting member being engagable with the locking member is used for restricting the locking member from rotating about the axis before moving away from the cover along the axis for a predetermined distance.

16. The locking structure as claimed in claim 15, wherein the restricting member drives the main body to rotate about the axis as the main body moving along the axis towards the cover.

17. The locking structure as claimed in claim 15, wherein the restricting member includes a first restricting portion; at least one protrusion protrudes from the driving member, at least one depression is defined in the first restricting portion for receiving the at least one protrusion for restricting the driving member from rotating about the axis.

18. The locking structure as claimed in claim 15, wherein each locking portion defines a first inclined surface and the hook defines a second inclined surface, the hook drives the corresponding locking portion to rotate about and move along the axis with the engagement between the first inclined surface and the second inclined surface.

19. A locking structure for locking a first object to a second object, comprising:

a hook disposed on the first object and being insertable through the second object; and a locking member disposed on the second object, comprising:

a main body with an axis; and a plurality of locking portions radially protruding from main body;

wherein the locking structure comprises a driving member, an elastic member, and a supporting member; the first object comprises a push portion; the push portion is used for driving the main body by the pressed first object; the supporting member comprises a receiving slot for partly receiving the main body, the main body moves along the axis and rotate about the axis when being partly received in the receiving slot, the locking portions rotates together with the main body to selectively engage with or disengage from the hook to lock the first object to or unlock the first object from the second object.

20. The locking structure as claimed in claim 19, wherein the locking structure further comprises a restricting member being engagable with the locking member for restricting the main body from rotating about the axis before moving along the axis in the first direction for a predetermined distance.

* * * * *